US008010889B2

(12) United States Patent
Gupta et al.

(10) Patent No.: US 8,010,889 B2
(45) Date of Patent: Aug. 30, 2011

(54) TECHNIQUES FOR EFFICIENT LOADING OF BINARY XML DATA

(75) Inventors: Nitin Gupta, Sunnyvale, CA (US); Sivasankaran Chandrasekar, Palo Alto, CA (US); Ravi Murthy, Fremont, CA (US); Nipun Agarwal, Santa Clara, CA (US)

(73) Assignee: Oracle International Corporation, Redwood Shores, CA (US)

( * ) Notice: Subject to any disclaimer, the term of this patent is extended or adjusted under 35 U.S.C. 154(b) by 882 days.

(21) Appl. No.: 11/743,563

(22) Filed: May 2, 2007

(65) Prior Publication Data
US 2008/0098001 A1 Apr. 24, 2008

Related U.S. Application Data

(60) Provisional application No. 60/853,236, filed on Oct. 20, 2006.

(51) Int. Cl.
*G06N 3/00* (2006.01)
(52) U.S. Cl. ...................................... 715/234
(58) Field of Classification Search .................. 715/234, 715/235, 236, 243, 254
See application file for complete search history.

(56) References Cited

U.S. PATENT DOCUMENTS

| | | | |
|---|---|---|---|
| 5,643,633 A | 7/1997 | Telford et al. | |
| 5,870,590 A | 2/1999 | Kita et al. | |
| 6,018,747 A | 1/2000 | Burns et al. | |
| 6,330,573 B1 | 12/2001 | Salisbury et al. | |
| 6,414,610 B1 | 7/2002 | Smith | |
| 6,427,123 B1 | 7/2002 | Sedlar | |
| 6,519,597 B1 | 2/2003 | Cheng et al. | |
| 6,523,062 B1 | 2/2003 | Bridgman et al. | |
| 6,598,055 B1 | 7/2003 | Keesey et al. | |
| 6,635,088 B1 * | 10/2003 | Hind et al. | 715/236 |
| 6,697,805 B1 | 2/2004 | Choquier et al. | |
| 6,883,137 B1 | 4/2005 | Girardot et al. | |

(Continued)

FOREIGN PATENT DOCUMENTS
WO WO 03107576 12/2003
(Continued)

OTHER PUBLICATIONS

Bayardo et al., "Optimizing encoding: An evaluation of binary xml encoding optimizations for fast stream based xml processing", May 2004, Proceedings of the 13th international conference on World Wide Web WWW 04', Publisher ACM press, 7 pages.

(Continued)

*Primary Examiner* — Kyle R Stork
(74) *Attorney, Agent, or Firm* — Hickman Palermo Truong & Becker LLP

(57) ABSTRACT

Various techniques are described hereafter for improving the efficiency of binary XML encoding and loading operations. In particular, techniques are described for incrementally encoding XML in response to amount-based requests. After encoding enough binary XML to satisfy an amount-based request, the encoder stops encoding the XML until a subsequent request is received. The incremental encoding may take place on the client-side or the server-side. Techniques are also described for reducing the character set conversion operations by having a parser convert tokens in text XML into one character set while converting non-token text in the text XML into another character set. Techniques are also described for generating self-contained binary XML documents, and for improving remap operations by providing a binary XML document on a chunk-by-chunk basis.

12 Claims, 5 Drawing Sheets

U.S. PATENT DOCUMENTS

| | | | |
|---|---|---|---|
| 7,013,425 | B2 | 3/2006 | Kataoka |
| 7,080,094 | B2 | 7/2006 | Dapp et al. |
| 7,089,567 | B2 * | 8/2006 | Girardot et al. ............... 719/330 |
| 7,139,746 | B2 | 11/2006 | Shin et al. |
| 7,143,397 | B2 | 11/2006 | Imaura |
| 7,162,485 | B2 | 1/2007 | Gottlob et al. |
| 7,171,404 | B2 | 1/2007 | Lindblad et al. |
| 7,171,407 | B2 * | 1/2007 | Barton et al. ......................... 1/1 |
| 7,216,127 | B2 | 5/2007 | Auerbach |
| 7,406,522 | B2 | 7/2008 | Riddle |
| 7,451,128 | B2 | 11/2008 | Song et al. |
| 7,523,119 | B2 | 4/2009 | Imamura et al. |
| 2001/0049675 | A1 | 12/2001 | Mandler et al. |
| 2002/0152267 | A1 | 10/2002 | Lennon |
| 2002/0188613 | A1 | 12/2002 | Chakraborty et al. |
| 2003/0093626 | A1 | 5/2003 | Fister |
| 2003/0131051 | A1 | 7/2003 | Lection et al. |
| 2003/0140308 | A1 | 7/2003 | Murthy et al. |
| 2003/0177341 | A1 | 9/2003 | Devillers |
| 2003/0212664 | A1 | 11/2003 | Breining et al. |
| 2003/0236903 | A1 | 12/2003 | Piotrowski |
| 2004/0010752 | A1 | 1/2004 | Chan et al. |
| 2004/0044659 | A1 | 3/2004 | Judd et al. |
| 2004/0132465 | A1 * | 7/2004 | Mattila et al. ............... 455/456.1 |
| 2004/0143791 | A1 | 7/2004 | Ito et al. |
| 2004/0167864 | A1 | 8/2004 | Wang et al. |
| 2004/0205551 | A1 | 10/2004 | Santos |
| 2004/0260691 | A1 | 12/2004 | Desai et al. |
| 2004/0261019 | A1 | 12/2004 | Imamura et al. |
| 2005/0033733 | A1 | 2/2005 | Shadmon et al. |
| 2005/0038688 | A1 | 2/2005 | Collins et al. |
| 2005/0050016 | A1 | 3/2005 | Stanoi et al. |
| 2005/0050054 | A1 | 3/2005 | Clark et al. |
| 2005/0091188 | A1 | 4/2005 | Pal et al. |
| 2005/0091588 | A1 | 4/2005 | Ramarao et al. |
| 2005/0102256 | A1 | 5/2005 | Bordawekar et al. |
| 2005/0120031 | A1 | 6/2005 | Ishii |
| 2005/0203957 | A1 | 9/2005 | Wang et al. |
| 2005/0228792 | A1 | 10/2005 | Chandrasekaran et al. |
| 2005/0229158 | A1 | 10/2005 | Thusoo et al. |
| 2005/0257201 | A1 | 11/2005 | Rose et al. |
| 2005/0278289 | A1 | 12/2005 | Gauweiler et al. |
| 2005/0278616 | A1 | 12/2005 | Eller |
| 2006/0005122 | A1 | 1/2006 | Lemoine |
| 2006/0021246 | A1 | 2/2006 | Schulze et al. |
| 2006/0047717 | A1 | 3/2006 | Pereira |
| 2006/0059165 | A1 | 3/2006 | Bosloy et al. |
| 2006/0200439 | A1 | 9/2006 | Bhatia et al. |
| 2006/0212467 | A1 | 9/2006 | Murthy et al. |
| 2006/0277179 | A1 | 12/2006 | Bailey |
| 2007/0043751 | A1 | 2/2007 | Chen et al. |
| 2007/0050704 | A1 | 3/2007 | Liu |
| 2007/0113221 | A1 | 5/2007 | Liu et al. |
| 2007/0208752 | A1 | 9/2007 | Khaladkar et al. |
| 2007/0271305 | A1 | 11/2007 | Chandrasekar et al. |
| 2008/0082484 | A1 | 4/2008 | Averbuch et al. |
| 2008/0091623 | A1 | 4/2008 | Idicula et al. |
| 2008/0098001 | A1 | 4/2008 | Gupta et al. |
| 2008/0098019 | A1 | 4/2008 | Sthanikam et al. |
| 2008/0098020 | A1 | 4/2008 | Gupta et al. |
| 2009/0112890 | A1 | 4/2009 | Medi et al. |
| 2009/0150412 | A1 | 6/2009 | Idicula et al. |
| 2009/0307239 | A1 | 12/2009 | Chandrasekar et al. |

FOREIGN PATENT DOCUMENTS

| | | | |
|---|---|---|---|
| WO | WO 2006026534 | | 3/2006 |

OTHER PUBLICATIONS

Liu et al., "XML retrieval: Configurable indexing and ranking for XML information retrieval", Jul. 2004, Proceedings of the 27th annual international ACM SIGIR conference on Research and development in information retrieval SIGIR 04', Pulished by ACM press, 12 pages.

Liefke et al., "Xmill: an efficient compressor for XML data", May 2000, ACM SIGMOD Record, Proceedings of the 2000 ACM SIGMOD international conference on Management of data SIGMOD 00', vol. 29 Issue 2, Publisher: ACM Press, 12 pages.

Min et al., "XML Indexing and compression: XPRESS: a queriable compression for XML data", Jun. 2003, Proceedings of the 2003 ACM SIGMOD international conference on Management of data SIGMOD 03', Published by ACM Press, 8 pages.

Zou et al., "XML Processing: Ctree: a compact tree for indexing XML data" Nov. 2004, Proceedings of the 6th annual international workshop on Web information and data management WIDM 04', Published by ACM Press, 10 pages.

PCT/US2007/010163, Notification of Transmittal of the International Search Report and the Written Opinion of the International Searching Authority, Oct. 12, 2007, 12 pages.

U.S. Appl. No. 11/601,118, filed Nov. 16, 2008, Office Action, Mailing Date Mar. 16, 2009.

U.S. Appl. No. 11/601,118, filed Nov. 16, 2008, Office Action, Mailing Date May 22, 2009.

U.S. Appl. No. 11/938,017, filed Nov. 9, 2007, Notice of Publication, Mailing Date May 14, 2009.

U.S. Appl. No. 11/938,020, filed Nov. 9, 2007, Notice of Publication, Mailing Date May 14, 2009.

U.S. Appl. No. 11/950,642, filed Dec. 5, 2007, Notice of Publication, Mailing Date Jun. 11, 2009.

Peer to Patent, Third Party submission for PGPUB 20090125495, "Optimized streaming evaluation of xml queries", Sep. 1, 2009.

Xiaogang Li, Agrawal, "Efficient Evaluation of XQuery over Streaming Data", 2005, $31^{st}$ VLDB Conference, pp. 265-276.

IBM Research, "XAOS: An Algorithm for Streaming XPath Processing with Forward and Backward Axes" 2003, pp. 1-2.

U.S. Appl. No. 11/317,101, filed Dec. 22, 2005, Notice of Allowance, Mailing Date Dec. 9, 2010.

Girardot et al., "Millau: an encoding format for efficient representation and exchange of XMLover the Web", IBM Almaden Research Center, 24 pages.

Shankar Pal et al., "Indexing XML Data Stored in a Relational Database", Proceedings of the $30^{th}$ VLDB Conference, 2004, 12 pages.

MacKenzie et al., "Finding Files", FindUtils, Version 4.1.2, Source Code, GNU.org, Nov. 1997, source files, code. C, 22 pages.

Cormen et al., "Introduction to Algorithms", MIT Press, 2001, $2^{nd}$ Edition, 4 pages.

European Patent Office, "Communication pursuant to Article 94 (3) EPC", European patent application 05732473.3-1225, dated Feb. 4, 2008, 7 pages.

State Intellectual Property Office of P.R.C., "Notification of the First Office Action", European patent application 2005800186273.9, dated Oct. 12, 2007, 9 pages.

Claims, European patent application 2005800186273.9, 3 pages.

Claims, European patent application 05732473.3-1225, 3 pages.

* cited by examiner

TECHNIQUES FOR EFFICIENT LOADING OF BINARY XML DATA

This application is related to and claims the benefit of priority from provisional Application No. 60/853,236 filed Oct. 20, 2006, entitled "Handling Binary Xml", the entire content of which is incorporated by this reference for all purposes as if fully disclosed herein.

This application is also related to the following applications, the content of which is incorporated by this reference for all purposes as if fully disclosed herein:

U.S. patent application Ser. No. 11/182,997, filed Jul. 14, 2005, entitled "Encoding Of Hierarchically Organized Data For Efficient Storage And Processing" (hereinafter the "Binary XML Application");

U.S. patent application Ser. No. 10/884,311, filed Jul. 2, 2004, entitled "Index For Accessing XML Data";

U.S. patent application Ser. No. 11/437,512, filed May 18, 2006, entitled "Efficient Piece-Wise Updates Of Binary Encoded Xml Data";

U.S. patent application Ser. No. 11/401,613, filed Apr. 10, 2006, entitled "A Mechanism For Improving Performance On Xml Over Xml Data Using Path Subsetting";

U.S. patent application Ser. No. 11/601,118, filed Nov. 16, 2006, entitled "CLIENT PROCESSING FOR BINARY XML IN A DATABASE SYSTEM" (hereinafter the "Client-side Processing Application);

U.S. patent application Ser. No. 11/707,730 filed Feb. 16, 2007, entitled "ENCODING INSIGNIFICANT WHITESPACE OF XML DATA"; and U.S. patent application Ser. No. 11/715,603 filed Mar. 7, 2007, entitled "INCREMENTAL MAINTENANCE OF AN XML INDEX ON BINARY XML DATA".

FIELD OF THE INVENTION

The present invention relates to encoding XML in a binary format and, more specifically, to techniques for efficiently encoding binary XML and loading the binary XML into a repository.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Binary XML

Binary XML is one format in which XML data can be stored in a database. Binary XML is a compact binary representation of XML that was designed to reduce the size of XML documents. One of the ways binary XML compresses data is by representing strings ("tokens") with fixed values.

In one implementation of binary XML, a mapping is established between character strings and replacement values, where the character strings are tag names, and the replacement values are numbers. Such mappings are referred to herein as "translation information".

For example, consider an XML document PO1 that contains the following content:

```
<Purchase Order>
   <body>
      Important Data
   </body>
</Purchase Order>
```

PO1 includes the tokens "Purchase Order" and "body". To store PO1 in binary XML format, the token "Purchase Order" may be mapped to 1, and the token "body" may be mapped to 2. Typically, the replacement values consume much less space than the corresponding tokens. For example, the token "Purchase Order", which contains fourteen characters, may be assigned a binary replacement value that takes less space to store than a single text character.

Once translation information has been created, XML documents may be stored in binary XML based on the translation information. For example, PO1 may be stored as <1><2>Important Data</2></1>. In typical implementations of binary XML, even the symbols (e.g. "<", ">", and "/") may be represented by binary replacement values.

Translating Between Binary XML and Text

When stored in binary XML, an XML document consumes much less space than is required by other formats of XML storage. However, the space savings is achieved at the cost of additional overhead required to convert textual XML to binary XML, and to convert binary XML to textual XML. For example, to be meaningful to an application that requests PO1, <1><2>Important Data</2></1> would have to be translated back into:

```
<Purchase Order>
   <body>
      Important Data
   </body>
</Purchase Order>
```

In order to reconstruct the text of an XML document that has been stored in binary format, the translation information that was used to encode the XML document must be available. The translation information that is used to store XML data within a database are typically stored separate from the binary XML data itself.

Translation Information

How database system stores translation information may hinge on whether the translation information is for known-schema XML or for unknown-schema XML. XML data is "known-schema" XML if the database server knows the XML schema to which the XML data conforms. The database server may "know" the schema, for example, if the schema has been registered with the database server.

On the other hand, XML data is "unknown-schema" XML if the database server does not know the schema to which the XML data conforms. Thus, unknown-schema XML includes both (a) XML documents that do not conform to any schema, and (b) XML documents that conform to an XML schema, but the XML schema is not known to the database server.

In some database systems, the translation information for known-schema binary XML is stored on a per-schema basis. Thus, since all documents that conform to a given schema will typically contain the same tag strings, the same translation information is used to encode all of the documents that conform to the given schema.

According to one embodiment, the translation information for known-schema binary XML is stored, in the database, as part of the definition of the schema. Schema definitions, in turn, are stored in a schema table.

In some database systems, the translation information for all unknown-schema binary XML are stored in tables referred to herein as "token tables". In one embodiment, three token tables are used to store the translation information for unknown-schema XML: a Qname token table, a namespace token table, and a path_id token table. The three token tables are collectively referred to as a "token table set".

The Qname token table for an XML schema contains the Qname-to-replacement-value mappings used to encode the Qnames contained in unknown-schema XML. The namespace token table for an XML schema contains the namespace-to-replacement-value mappings used to encode the namespaces contained in unknown-schema XML. The path_id token table for an XML schema contains the path_id-to-replacement-value mappings used to encode the path_ids contained in unknown-schema XML.

Server-Side Translation

Currently, client programs do not understand Binary XML data. Consequently, data is sent from client programs to the database as XML text. Within the database server, the XML text is parsed and encoded to the Binary format. Similarly, when client programs need to read XML data which has been stored in the Binary format, the data is converted to the text on the server and sent over to the client as XML text where it needs to be parsed to be operated upon.

FIG. 1 is a block diagram of a system that uses server-side translation of binary XML. Referring to FIG. 1, a client 102 sends text formatted XML 104 to a database server 106 for storage in a database 110. Upon receiving the textual XML 104 from the client 102, an encoder/decoder 108 within the database server 106 encodes the XML into binary XML 112 based on translation information 116 retrieved from the database 110. Once encoded, the binary XML 112 may be stored in a binary XML repository 114 within the database 110.

The retrieval of binary XML from database 110 works in a similar manner. Specifically, the binary XML is retrieved from the database 110, decoded by the database server 106 using encoder/decoder 108 and translation information 116, and the textual version of the XML is sent back to the client 102.

Unfortunately, sending uncompressed data across the wire from client to server and server to client in this manner requires a significant amount of network bandwidth, which is expensive. In addition, the database server CPU has to spend extra cycles trying to parse the XML text coming from clients, and to print the encoded text to the text format that is sent to clients. The server-side operations adversely affect the scalability of the database server.

Client-Side Translation

The Client-side Processing Application describes a system in which the translation is performed on the client-side. Performing the translation on the client-side increases scalability by reducing the amount of work the server must perform as XML data is stored into and retrieved from binary XML repository 114. As also described in the Client-side Processing Application, a client-side cache of translation information may be used to further improve the performance of operations that load binary XML into XML documents within binary XML repository 114. It is clearly desirable to provide further techniques to improve the speed, increase the scalability, and reduce the memory consumption, of binary XML loading operations.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Overview

Various techniques are described hereafter for improving the efficiency of binary XML encoding and loading operations. Specifically, techniques are described for incrementally encoding XML in response to amount-based requests. After encoding enough binary XML to satisfy an amount-based request, the encoder stops encoding the XML until a subsequent request is received. The incremental encoding may take place on the client-side or the server-side.

In one embodiment, the encoding requests are generated by a process responsible for storing the encoded binary XML (an "XML-storing process"). In such an embodiment, the XML storing process may determine how much data to request in the amount-based requests based on how much data the XML-storing process can directly store into the appropriate storage within the XML repository. Consequently, the XML-storing process need not buffer a copy of the binary XML prior to storing the binary XML into the repository.

Client-Side Translation Example

Figure 1:
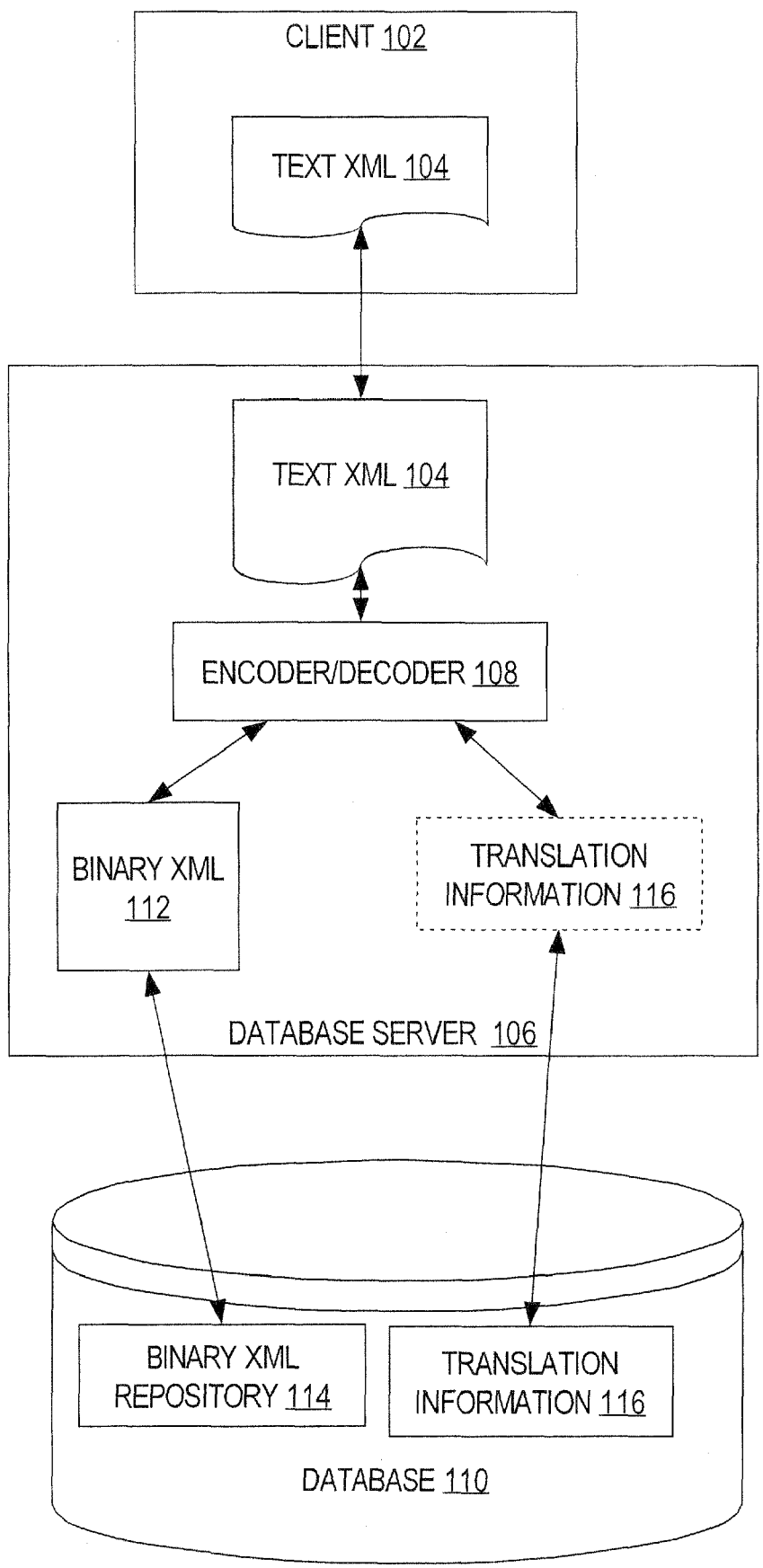
FIG. 1 is a block diagram of a system that uses server-side translation of binary XML.
Figure 2:
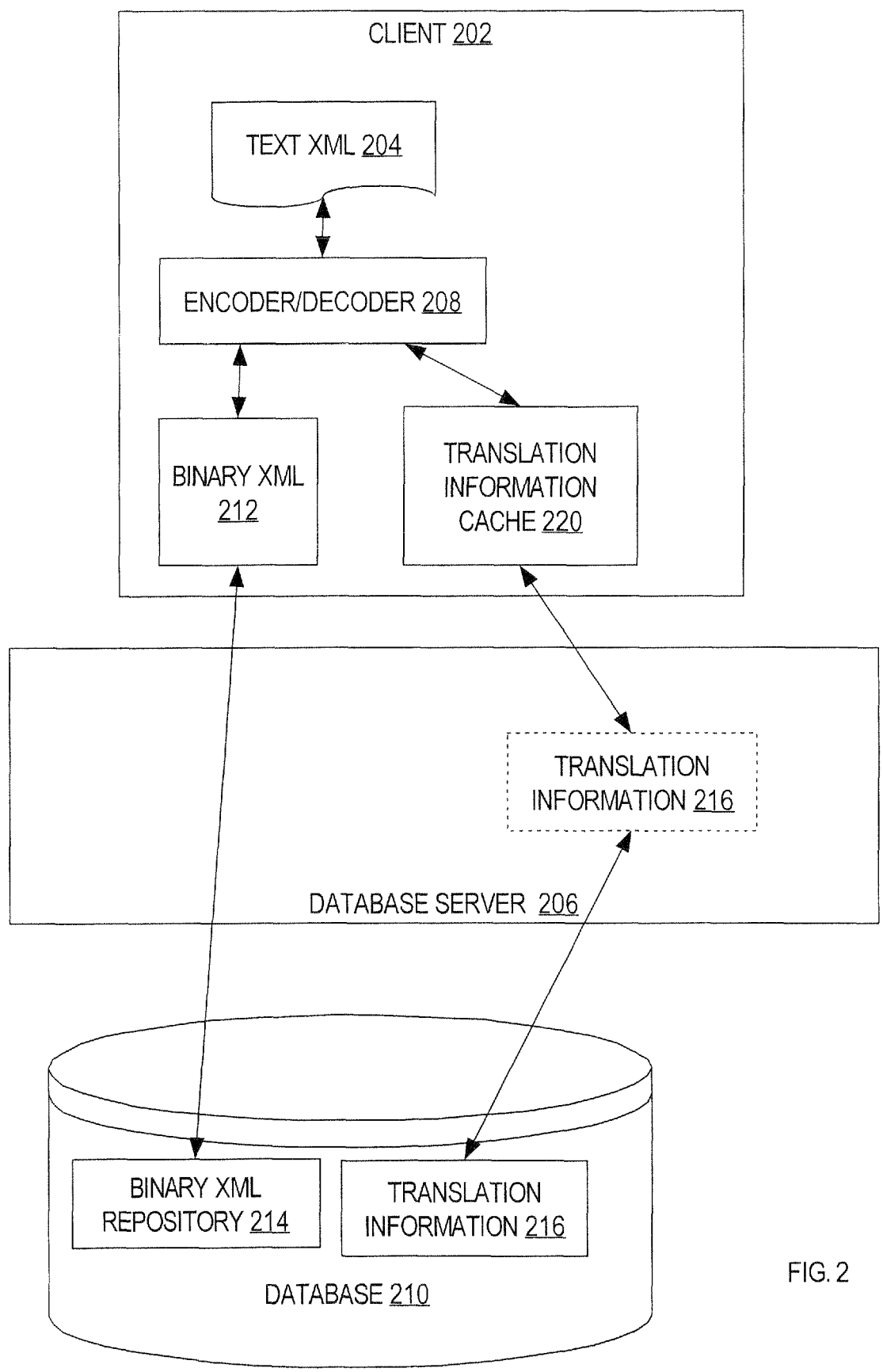
FIG. 2 is a block diagram of a system that uses client-side translation of binary XML, according to an embodiment of the invention.

FIG. 2 illustrates a system that uses client-side translation of binary XML. In the illustrated system, an encoder/decoder 208 within a client 202 encodes textual XML 204 into binary XML 212 based on translation information 216 retrieved from the database 210. Once encoded, the client 202 sends the binary XML 212 to a database server 206 for storage in the database 210.

The retrieval of binary XML from database 210 works in a similar manner. Specifically, the database server 206 retrieves the binary XML 212 from binary XML repository 214 within the database 210, and sends the binary XML 212 to the client 202. Within the client 202, the binary XML is decoded using encoder/decoder 208 and translation information 216, to reconstruct the textual version of the XML inside client 202. In the illustrated embodiment, the client 202 maintains the translation information 216 within a client-side translation information cache 220.

Client-Side Cache of Translation Information

Using client-side translation, less bandwidth is used in the client/server communications, and fewer server-side computational resources are required to support the storage of binary XML. However, to do the encoding or decoding of the data efficiently on the client side, the client has to have the appropriate translation information. Such translation information includes the token-to-replacement-value mappings that are stored in the schema table and/or token tables within the database.

When the client needs to encode or decode an XML document, the client 202 obtains the translation information 216 required for the operation from the database 210 by sending a request for the translation information to the database server 206. However, to avoid the need to query the database server 206 every time an XML document needs to be encoded/decoded, the client 202 may maintain a cache 220 of the translation information. By maintaining a client-side cache 220 of translation information, the client 202 need only query the database server 206 for translation information 216 if the translation information 216 does not already reside in the cache 220.

On-Demand XML Encoding

Figure 3:
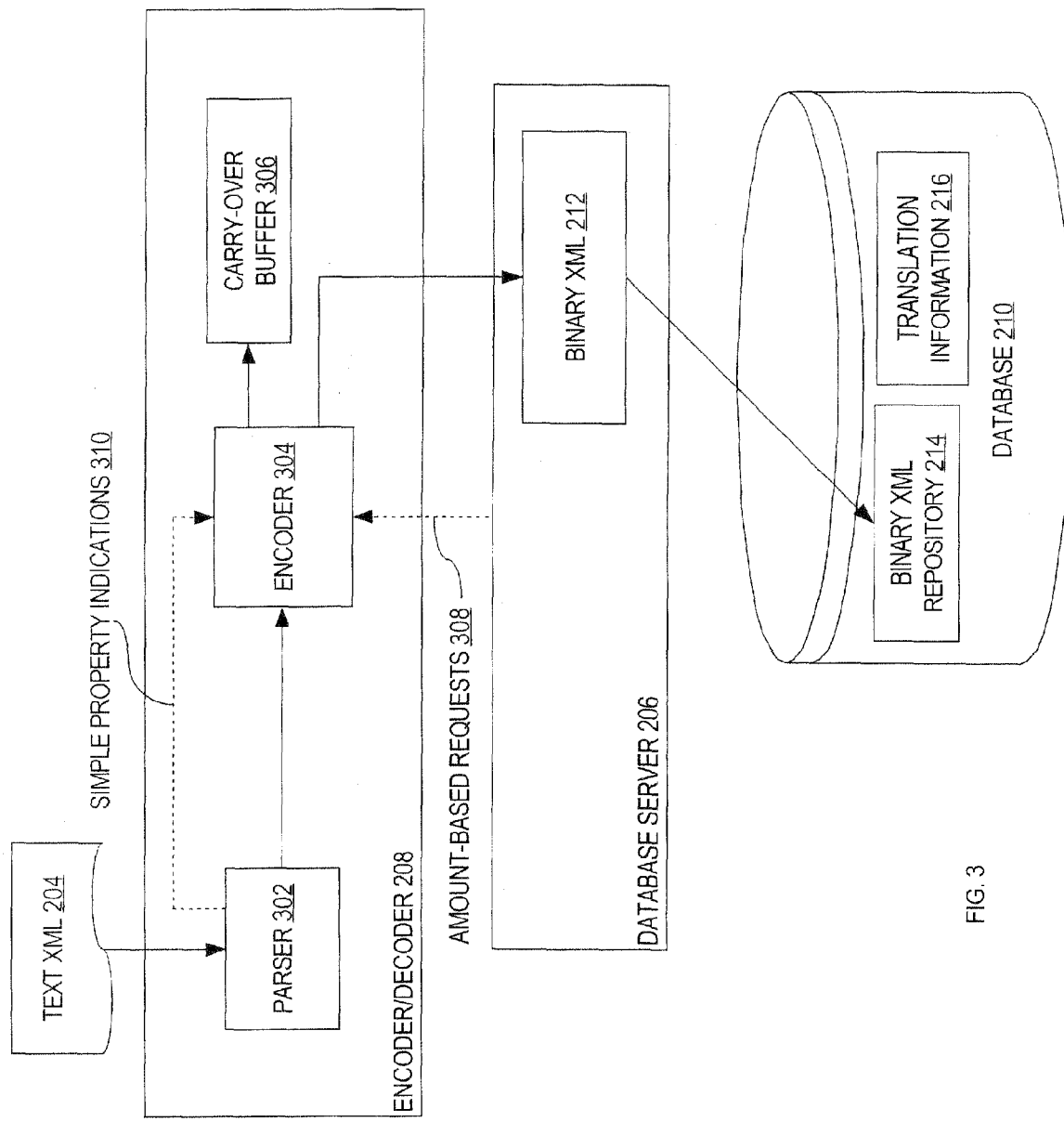
FIG. 3 is a block diagram of a system that includes an encoder configured to incrementally encode XML in response to amount-based requests, according to an embodiment of the invention.

As mentioned above, techniques are described herein for incrementally encoding XML in response to amount-based requests. FIG. 3 is a block diagram of a system that includes an encoder 304 configured to incrementally encode XML in response to amount-based requests 308. Encoder 304 may be part of encoder/decoder 208, illustrated in FIG. 2.

While on-demand binary XML encoding is described herein with reference to an embodiment in which the encoding is performed on the client-side, on-demand binary XML encoding may also be performed by embodiments that employ server-side encoding.

In one embodiment, the XML-storing process, which is responsible for storing the encoded binary XML in the binary XML repository 214, determines how much data to request in the amount-based requests based on how much data the XML-storing process can directly store into the appropriate storage within the XML repository. Consequently, the XML-storing process need not buffer a copy of the binary XML prior to storing the binary XML into the repository. Thus, in the system illustrated in FIG. 3, database server 206 determines how much space is available within binary XML repository 214 for storing binary XML 212. Database server 206 then sends an amount-based request 308 to encoder 304 for that amount.

In response to an amount-based request, encoder 304 decodes a sufficient amount of text XML 204 to produce the requested amount of binary XML data. Encoder 304 then provides the requested amount of binary XML data to database server 206, which is able to immediately store the binary XML into binary XML repository 214. By incrementally encoding the XML in response to amount-based requests, and generating amount-based requests based on how much binary XML data can be directly stored into the binary XML repository 214, the need for the database server 206 to buffer a copy of the binary XML is avoided.

FIG. 3 illustrates on-demand encoding of XML in a system that uses a client-side encoder. However, as mentioned above, the on-demand encoding techniques described herein may be used with server-side translation systems also. In both cases, on-demand encoding may be used to avoid the need of the XML-storing process to buffer a copy of the encoded binary XML, which would subsequently have to be loaded into the appropriate structure (e.g. a BLOB) within the binary XML repository 214.

The Carry-Over Buffer

Even though the requests are amount-based, the encoding of binary XML is performed on a per-node basis. Consequently, the encoding performed in response to an amount-based request may produce more binary XML than the requested amount. For example, assume that text XML 204 includes three nodes A, B and C, in that order. Assume further that nodes A, B, and C respectively translate into 10, 5, and 10 bytes of binary XML. Under these circumstances, encoder 304 would respond to an amount-based request for 12 bytes by encoding both nodes A and B. However, encoding A and B produces 15 bytes, which is 3 bytes more than the requested 12 bytes.

According to one embodiment, encoder 304 is configured to handle such overflow conditions by storing the binary XML data that exceeds the requested amount in a carry-over buffer 306. The binary XML in the carry-over buffer 306 is then used to satisfy the next amount-based request. If the amount in the carry-over buffer 306 is not sufficient to satisfy the next amount-based request, then encoder 304 encodes one or more additional nodes until enough binary XML has been produced to satisfy the amount-based request.

For example, after encoding nodes A and B, encoder 304 would provide the first 12 bytes to database server 206 in response to the request, and store the remaining 3 bytes in carry-over buffer 306. Those 3 bytes would remain in carry-over buffer 306 until the next amount-based request 308 from database server 206. For the purpose of explanation, assume that the next amount-based request 308 from database server 206 was for another 12 bytes of binary XML data. The 3 bytes of node B that currently reside in the carry-over buffer 306 are not sufficient to satisfy the 12 byte request, so encoder 304 encodes node C. Encoding node C produces 10 bytes. The 10 bytes from node C, combined with the three remaining bytes of node B, are sufficient to satisfy the 12 byte request. Therefore, the 3 bytes of node B, and the first 9 bytes of node C, are used to satisfy the 12 byte request. The remaining byte of node C is stored in the carry-over buffer 306 until the next amount-based request 308.

Parser-Indicated Use of Simple Property Opcodes

A simple property is a property, within XML data, that either has no children, or has only a text child. Thus, in the following XML snippet:

```
<a>
    <b>text</b>
    <c>text</c>
</a>
``` node <a> is not a simple property, but nodes <b> and <c> are simple properties.

According to one embodiment, encoder 304 uses a simple property optimized opcode (referred to hereafter as "SPOO") to better compress the binary XML. A SPOO is an opcode that represents an entire simple property. In one embodiment, the SPOO is followed by several operands, including (a) an operand indicating the token id of the node, (b) an operand that indicates the length of the data associated with the simple property, and (c) the actual data itself.

Unfortunately, encoding simple properties using a SPOO is complicated by the fact that encoder 304 generally does not know that a node that is being parsed is going to be a simple property until encoder 304 has received a certain pattern of events from parser 302. Specifically, in response to parsing a simple property, parser 302 would typically generate three separate events: a start-of-element event indicating the start of an element, a characters event indicating the start of text, and an end-of-element event. Until encoder 304 receives all three of these events, the encoder 304 will not know that the property that is being encoded is a simple property.

If XML data conforms to a known XML schema, the XML schema may indicate which properties are simple properties and which properties are not. However, even when the schema indicates that a particular node is a simple property, the actual XML for the node may include comments or other information that may prevent the node from being encoded as a simple property.

To encode simple properties using a SPOO, encoder 304 may be configured to buffer the data provided by parser 302 until encoder 304 has received enough information to tell whether the current node is a simple property. However, to do so may involve having the encoder 304 separately buffer a large amount of data. Therefore, according to one embodiment, encoder 304 is configured to receive, from parser 302, simple property indications 310. By sending encoder 304 a simple property indication, parser 302 indicates that the current node is a simple property. In response, encoder 304 may immediately generate a SPOO and begin encoding the simple property accordingly. If encoder 304 does not receive a simple property indication 310, then encoder 304 may proceed with normal opcode encoding, without having to buffer a large amount of output from parser 302.

According to one embodiment, the simple property indication produced by the parser 302 is in the form of a compound event, where the compound event is a single event that represents the three events (start-of-element, characters, end-of-element) that the parser 302 would normally produce for a simple property. In one embodiment, the compound event includes the element name, the text name and length, and the namespace of the element. In response to receiving the compound event, the encoder 304 generates a SPOO and proceeds to encode the simple property by generating the operands associated with the SPOO.

In many cases, the parser 302 will have sufficient information to identify simple properties with relative ease. In some cases, however, parser 302 may not be able to easily determine whether an element is a simple property. According to one embodiment, if the amount of resources required for the parser 302 to determine whether a node is a simple property exceeds a certain threshold, the parser 302 simply assumes that the node is not a simple property. Thus, instead of sending a compound event, parser 302 generates three events. In response to these events, encoder 304 will generate binary XML without using the SPOO opcode.

Because parser 302 sends simple property indications 310 to encoder 304, a SPOO can be used to encode simple properties without excessive buffering by the encoder 304. Further, excessive buffering by the parser 302 may be avoided by assuming that a node is not a simple property if the simple property determination would require too much overhead. Thus, the benefit of increased compression that results from using a SPOO may be obtained without introducing a significant amount of additional overhead into the parsing and encoding operations.

Character-Set Conversions

During the encoding process, tokens (which typically take the form of character strings that represent tags) are replaced with identifiers, as explained above. The component of the database server responsible for maintaining the mapping between tokens and their corresponding identifiers is referred to as a token manager.

In one embodiment, the token manager stores the token-to-identifier mapping information in database tables within the database. Typically, the tokens stored in database tables will be encoded in a particular character set, referred to herein as the "stored-token character set". In one embodiment, the stored token character set is UTF8.

The character set of the text XML 204 that is encoded by encoder 304 is referred to herein as the "input character set". The input character set may vary from document to document. When the input character set is not the same as the stored token character set, the parser 302 converts the tokens within the text XML from the input character set to the token character set.

Specifically, a token is converted from the input character set to the database character set to produce a token-character-set token. When the encoder 304 needs to encode a token, the token-character-set token is used by the token manager to look up the identifier for the token. The token manager returns the retrieved identifier to the encoder 304, which replaces the token with the identifier to generate the binary XML representation of the token.

In addition to tokens, the text XML 204 will typically include other text, which is also in the input character set. Prior to being storing in the database as part of the binary XML stream, that other text needs to be converted from the input character set to the default character set for the database (the "database character set"). Frequently, the database character set is different from both the input character set and the token character set.

If parser 302 converts all of the text XML 204 into the same character set, then a second character set conversion must be performed on some of the text. Specifically, if all of the text XML 204 is converted to the database character set, then the tokens have to be converted again from the database character set to the token character set. On the other hand, if all of the text XML 204 is converted to the token character set, then the non-token text in the input stream must be converted again from the token-character-set to the database character set.

According to one embodiment, this second round of character set conversions is avoided by adapting the parser to directly convert the token text into one character set, while at the same time converting the non-token text into different character set. Specifically, the parser receives one input parameter value that indicates the token-character-set, and a separate input parameter value that indicates the database character set. During the parsing process, the parser identifies which text are tokens, and which text are not tokens. Text that represents tokens is converted directly to the token character set, and text that does not represent tokens is converted directly to the database character set. By having the parser convert text in this manner, neither the tokens nor non-token text need to be subjected to a subsequent round of character set conversion.

Self-Contained Mode

According to one embodiment, encoder 304 has a mode of operation referred to herein as "self-contained mode". When operating in self-contained mode, all the generated token-id mappings are in-lined into the encoded document. Thus, the binary XML stream 212 generated by encoder 304 includes both the encoded binary XML, and the translation information necessary to translate the encoded binary XML back into text XML.

The self-contained encoded data can then be transferred across several tiers. At each tier the data can be efficiently decoded without needing any separate token-id mapping information. Thus, the need of costly parsing at each tier is avoided. In addition, network bandwidth usage is reduced because the encoded data is compressed.

When self-contained mode is used, the token-id mappings may vary from document to document, even for documents that belong to the same schema. Such variance is permissible because the documents are decoded using the token-id mappings that are contained in the documents, rather than using any schema-wide token-id mappings.

When the encoding is performed on the client-side, self-contained mode allows efficient encoding of data on the client side without any server round trips. Specifically, the encoder 304 can generate its own token-id mapping without regard to any translation information from the database 210.

According to one embodiment, the token-id mapping for each self-contained binary-encoded XML document is stored at the beginning of the binary encoded XML document. In an alternate embodiment, the token-id mapping information is spread throughout the document. For example, in one embodiment, each token-id mapping is located, within the document, immediately before the first portion of the document that needs to be decoded using the token-id mapping.

Self-contained mode may be particularly useful in situations in which the encoder 304 is on a machine that does not currently have a good connection with the database server 206. Encoder 304 may proceed with encoding a known-schema document without obtaining the translation information for the known-schema from the database server 206. Once the connection has been established, the self-contained binary encoded document may be stored in the database 210 without further translation, even though the token-id mapping used by the document is inconsistent with the translation information 216 for that know schema. In an alternative embodiment, prior to storing a self-contained binary encoded document, the database server 206 remaps the binary encoded XML so that the XML is consistent with the stored translation information 216 for the corresponding XML schema. After the remapping, the binary XML data may be stored without the token-id mappings, as non-self-contained binary XML.

In one embodiment, binary XML repository 214 may contain, for the same schema, both self-contained binary XML documents, and binary XML documents that are not self-contained. In such an embodiment, the encoder 304 encodes each binary XML document with a flag to indicate whether the binary XML document is self-contained. Therefore, when decoding a binary XML document, the decoder first inspects the self-contained flag. If the self-contained flag indicates that the binary XML document is self-contained, then the decoder retrieves the token-id mappings from the document itself. On the other hand, if the self-contained flag indicates that the binary XML document is not self-contained, then the decoder retrieves the translation information 216 that is associated with the XML schema with which the XML document is associated.

Chunk-Based Provision of Client-Generated Token Mappings

As mentioned above, there are various circumstances in which it may be desirable to remap binary encoded XML data. In particular, remapping may be desirable in any circumstance in which binary XML was encoded based on mappings that differ from the mappings represented in the translation information 216 stored in the database 210. For example, remapping may be performed to convert a self-contained binary XML document into a binary XML document that is not self-contained.

During a remap operation, binary XML that conforms to a first set of token-id mappings (the "initial mappings") is modified to conform to a second set of token-id mappings (the "target mappings"). Thus, if a token X maps to an identifier Y in the initial mappings, and token X maps to an identifier Z in the target mappings, then identifier Y is replaced with identifier Z in the remap operation.

One way to perform remap operations is to provide to the process that is performing the remap operations (the "remap process") the entire set of initial mappings. Once the remap process has the entire set of initial mappings, the remap process may analyzing the binary XML to detect any identifiers that belong to initial mappings. When any such identifier is found, the remap process replaces it with the corresponding identifier from the target mappings.

According to one embodiment, a technique referred to herein as "chunking" is used to improve the efficiency of remap operations. Chunking involves splitting the encoded data into chunks. In one embodiment, the chunks are of a fixed size. Each chunk maintains token-id mappings that (1) were generated for encoding data within that chunk, and (2) which have not occurred in any previous chunk.

For example, assume that the original XML text includes tokens A, B, C, B, and D, in that order. Assume further that the XML text is encoded into three chunks of binary XML (chunk1, chunk2 and chunk3) based on the following initial mapping:

A→id1
B→id2
C→id3
D→id4

Finally, assume that, within the encoded binary XML, id1 appears in chunk1, id2 and id3 appear in chunk2, and id2 and id4 appear in chunk3. This scenario is illustrated in FIG. 4.

Under these circumstances, the start-chunk opcode for chunk1 will be followed by the A→id1 mapping. The start-chunk opcode for chunk2 will be followed by the B→id2 and C→id3 mappings. The start-chuck opcode for chunk3 will be followed by the D→id4 mapping. Even though chunk3 includes id2, chunk3 does not include the B→id2 mapping because the B→id2 mapping was included in a preceding chunk (chunk2). Consequently, the process performing the re-mapping will already have knowledge of the B→id2 mapping by the time that chunk3 is being remapped.

Figure 4:
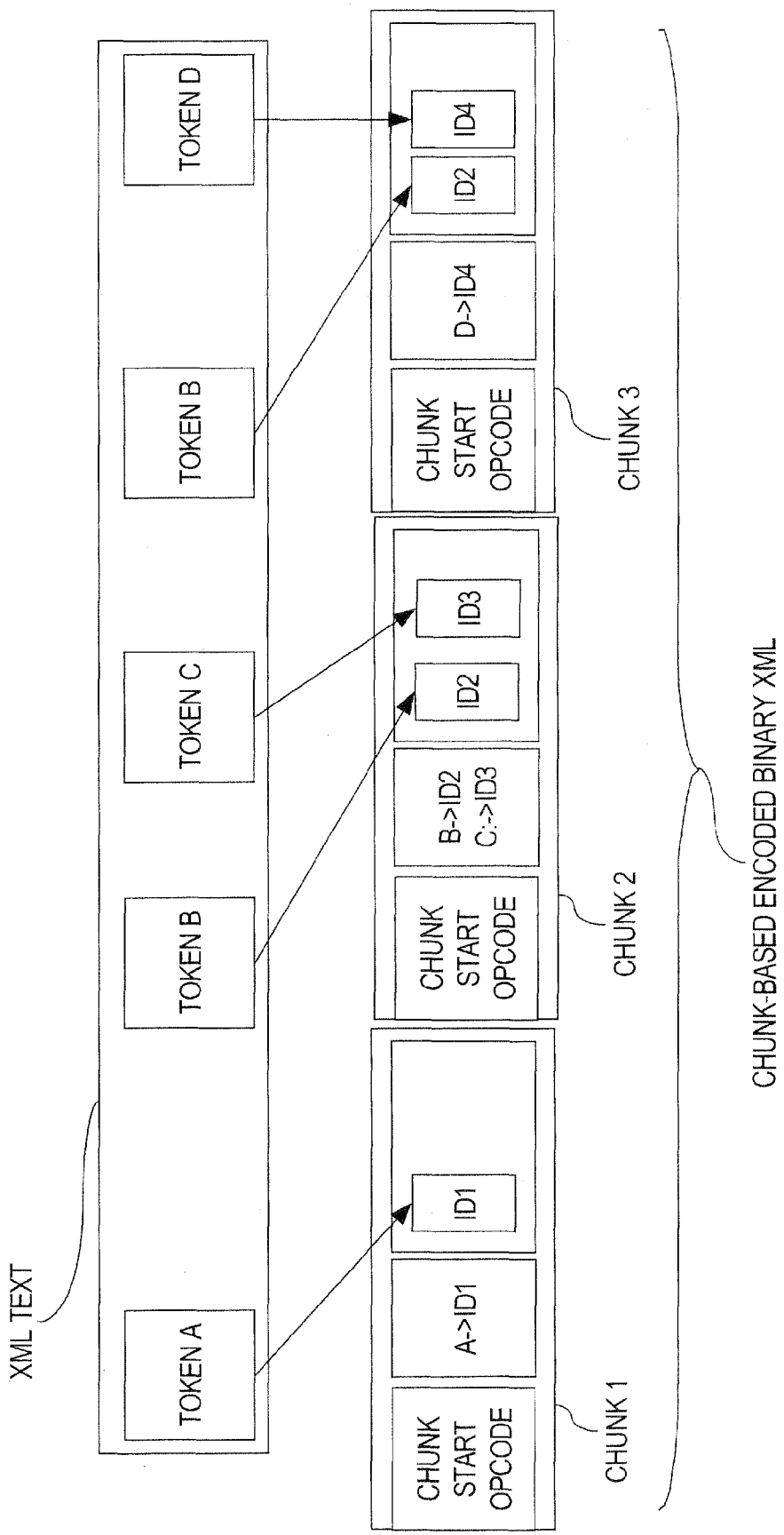
FIG. 4 is a block diagram that illustrates chunks formed by a chunking technique to improve the efficiency of remap operations, according to an embodiment of the invention.

By providing the initial mapping function on a chunk-by-chunk basis, as illustrated in FIG. 4, the efficiency of remap operations is significantly increased. Specifically, when the remap process is remapping chunk1, the remap process need only look for id1 within chunk 1, since A→id1 is the only mapping that the remap process is aware of. Looking for id1 may involve, for example, doing hash table lookups in a hash table that has an entry for id1.

When remapping chunk 2, the remap process is aware of A→id1, B→id2 and C→id3. Therefore, the remap process only needs to search for id1, id2 and id3 within chunk 2. In an embodiment that uses a hash table, the remap process may add to the hash table (which already contains an entry for id1) entries for id2 and id3. Once populated with entries for id2 and id3, the remap process may used the hash table to process chunk2.

Finally, when processing chunk3, the remap process becomes aware of D→id4. Therefore, the remap process adds a hash table entry for id4 to the hash table, and uses the hash table when processing chunk3 to search for id1, id2, id3 and id4.

As is illustrated by this example, chunking increases efficiency of remap operations by reducing the number of identifiers for which the remap process is searching. Specifically, when processing chunk1, the remap process did not need to look for id2, id3 and id4. Similarly, when processing chunk2, the remap process did not need to look for id4. Only when the last chunk, chunk3, was being processed, did the remap process have to search for all of the identifiers from the initial mapping. In an implementation that uses a hash table to locate identifiers that need to be remapped, the hash table is gradually populated as chunks are processed, thereby deferring the resource usage of a fully populated hash table.

The Remap Flag

In one embodiment, the chunks are generated by an encoder 304 that uses server-provided mapping information to encode some tokens, and client-generated mapping information to encode other tokens. During remap operations, only the identifiers that were generated based on client-generating mappings need to be remapped. Identifiers that were generated based on server-provided mappings are already consistent with the translation information 216 contained in the database 210.

According to one embodiment, when generating a chunk, the encoder 304 keeps track of whether client-generated mappings were used to encode anything represented by the chunk. If any client-generated mappings were used to encode anything within a chunk, then encoder 304 sets a "remap flag" within the chunk to indicate that something within the chunk needs to be remapped. If no client-generated mappings were used to encode a chunk, then encoder 304 sets the remap flag to indicate that the chunk does not to be remapped.

When the remap process receives a chunk, the remap process inspects the remap flag. If the remap flag indicates that chunk does not need to be remapped, then the remap process does not analyze the chunk. Rather, the encoded binary XML contained within the chunk is stored into binary XML repository 214 without any identifier conversions. If the remap flag indicates that the chunk needs to be remapped, then the remap process processes the chunk as described above.

Hardware Overview

Figure 5:
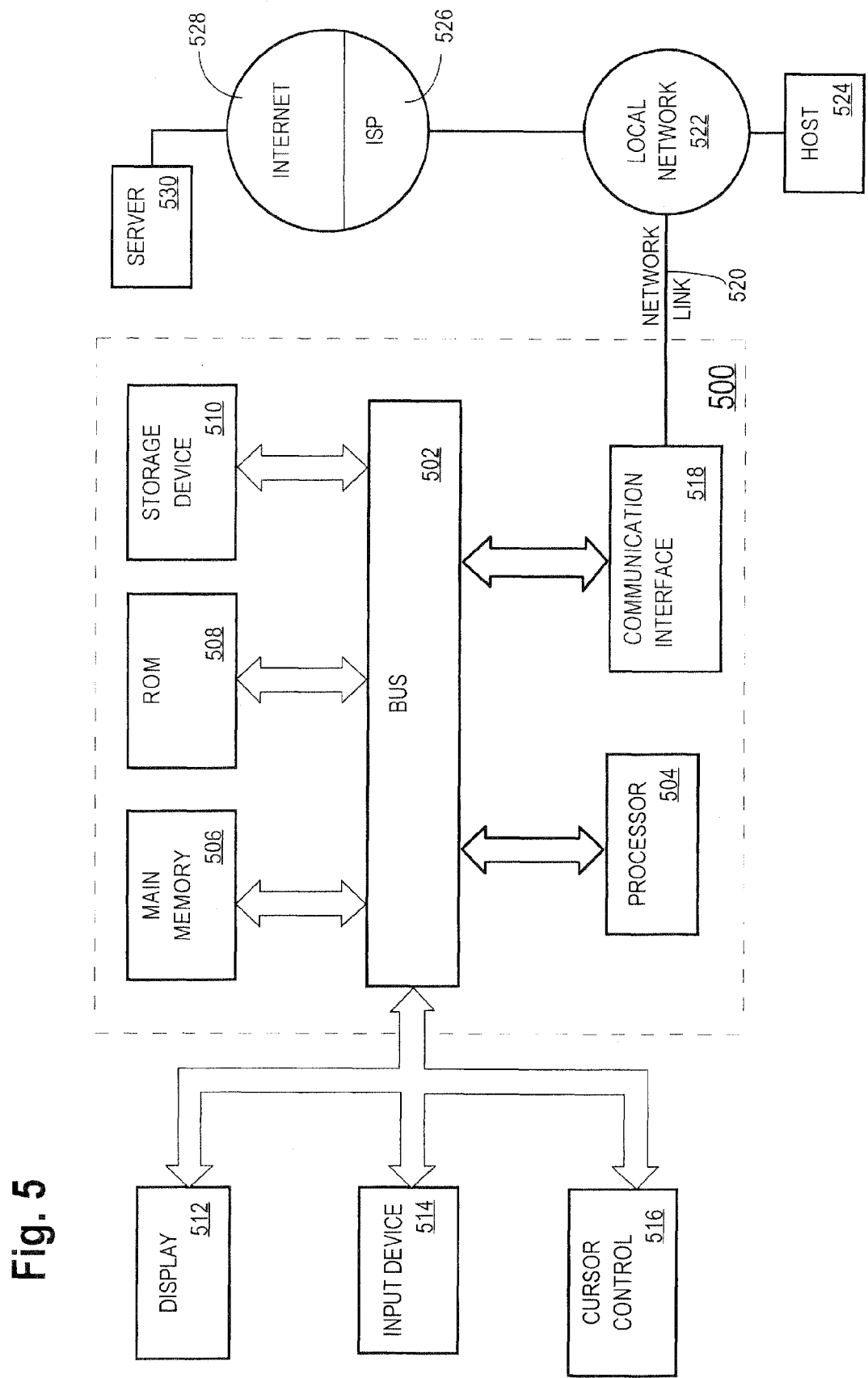
FIG. 5 is a block diagram of a computer system that may be used to implement embodiments of the invention.

FIG. 5 is a block diagram that illustrates a computer system 500 upon which an embodiment of the invention may be implemented. Computer system 500 includes a bus 502 or other communication mechanism for communicating information, and a processor 504 coupled with bus 502 for processing information. Computer system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions to be executed by processor 504. Computer system 500 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 500 may be coupled via bus 502 to a display 512, such as a cathode ray tube (CRT), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

The invention is related to the use of computer system 500 for implementing the techniques described herein. According to one embodiment of the invention, those techniques are performed by computer system 500 in response to processor 504 executing one or more sequences of one or more instructions contained in main memory 506. Such instructions may be read into main memory 506 from another machine-readable medium, such as storage device 510. Execution of the sequences of instructions contained in main memory 506 causes processor 504 to perform the process steps described herein. In alternative embodiments, hard-wired circuitry may be used in place of or in combination with software instructions to implement the invention. Thus, embodiments of the invention are not limited to any specific combination of hardware circuitry and software.

The term "machine-readable medium" as used herein refers to any medium that participates in providing data that causes a machine to operation in a specific fashion. In an embodiment implemented using computer system 500, various machine-readable media are involved, for example, in providing instructions to processor 504 for execution. Such a medium may take many forms, including but not limited to, non-volatile media, volatile media, and transmission media. Non-volatile media includes, for example, optical or magnetic disks, such as storage device 510. Volatile media includes dynamic memory, such as main memory 506. Transmission media includes coaxial cables, copper wire and fiber optics, including the wires that comprise bus 502. Transmission media can also take the form of acoustic or light waves, such as those generated during radio-wave and infra-red data communications. All such media must be tangible to enable the instructions carried by the media to be detected by a physical mechanism that reads the instructions into a machine.

Common forms of machine-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of machine-readable media may be involved in carrying one or more sequences of one or more instructions to processor 504 for execution. For example, the instructions may initially be carried on a magnetic disk of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 500, are exemplary forms of carrier waves transporting the information.

Computer system 500 can send messages and receive data, including program code, through the network(s), network link 520 and communication interface 518. In the Internet example, a server 530 might transmit a requested code for an application program through Internet 528, ISP 526, local network 522 and communication interface 518.

The received code may be executed by processor 504 as it is received, and/or stored in storage device 510, or other non-volatile storage for later execution. In this manner, computer system 500 may obtain application code in the form of a carrier wave.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method for encoding a particular text XML, comprising the computer-implemented steps of:
   receiving a request for a first specified amount of binary encoded XML, wherein the first specified amount is less than the entire amount that would be produced by encoding the entire particular text XML, and wherein the first specified amount is a numerical value that communicates a size that equates to a particular number of bytes;
   in response to the request, encoding one or more nodes from the particular text XML on a per-node basis until a first amount of binary XML, which has been generated to satisfy the request, is equal to or greater than the first specified amount;
   responding to the request with a second amount of binary XML, wherein the second amount of binary XML is not greater than the first specified amount;
   once the request has been satisfied, ceasing to encode the particular text XML until receiving a subsequent request for binary encoded XML;
   receiving the subsequent request for a second specified amount of binary encoded XML;
   in response to the subsequent request, continuing to encode the particular text XML from a node that is subsequent to the one or more nodes that were used to generate the first amount of binary XML; and
   responding to the subsequent request with a third amount of binary XML, wherein the third amount of binary XML is not greater than the second specified amount;
   wherein the steps of the method are performed by one or more computer systems.

2. The method of claim 1, wherein:
   the first amount of binary XML exceeds the first specified amount by a fourth amount of binary XML; and
   the method further includes:
      storing the fourth amount of binary XML in a carry-over buffer until receiving the subsequent request for binary encoded XML; and
      using said fourth amount of binary XML to satisfy said subsequent request for binary encoded XML.

3. The method of claim 2, wherein the second specified amount is greater than said fourth amount of binary XML, and wherein continuing to encode the particular text XML further comprises:
   determining a difference between the second specified amount and said fourth amount of binary XML;
   encoding the particular text XML to produce a portion of binary XML that is greater than said difference; and
   including, in the third amount of binary XML, the portion of binary XML and said fourth amount of binary XML.

4. The method of claim 1 wherein the step of encoding the particular text XML is performed at a database server that stores the binary XML in an XML repository.

5. The method of claim 1 wherein:
   the step of encoding the particular text XML is performed at a client, and
   the request is from a database server that manages an XML repository.

6. The method of claim 5 wherein the database server repeatedly sends the client requests for specific amounts of binary XML, and loads the binary XML that the database server receives in response to the requests directly into a structure within the database repository without buffering a copy of the binary XML.

7. A non-transitory computer-readable storage medium storing one or more sequences of instructions which, when executed by one or more processors, cause the one or more processors to perform steps comprising:
   receiving a request for a first specified amount of binary encoded XML, wherein the first specified amount is less than the entire amount that would be produced by encoding the entire particular text XML, and wherein the first specified amount is a numerical value that communicates a size that equates to a particular number of bytes;
   in response to the request, encoding one or more nodes from the particular text XML on a per-node basis until a first amount of binary XML, which has been generated to satisfy the request, is equal to or greater than the first specified amount;
   responding to the request with a second amount of binary XML, wherein the second amount of binary XML is not greater than the first specified amount;
   once the request has been satisfied, ceasing to encode the particular text XML until receiving a subsequent request for binary encoded XML;
   receiving the subsequent request for a second specified amount of binary encoded XML;
   in response to the subsequent request, continuing to encode the particular text XML from a node that is subsequent to the one or more nodes that were used to generate the first amount of binary XML; and
   responding to the subsequent request with a third amount of binary XML, wherein the third amount of binary XML is not greater than the second specified amount.

8. The non-transitory computer-readable storage medium of claim 7, wherein:
   the first amount of binary XML exceeds the first specified amount by a fourth amount of binary XML; and
   the one or more sequences of instructions further comprise instructions which, when executed by the one or more processors, cause the one or more processors to perform the steps of:
      storing the fourth amount of binary XML in a carry-over buffer until receiving the subsequent request for binary encoded XML; and
      using said fourth amount of binary XML to satisfy said subsequent request for binary encoded XML.

9. The non-transitory computer-readable storage medium of claim 8, wherein the second specified amount is greater than said fourth amount of binary XML, and wherein the instructions that cause continuing to encode the particular text XML further comprise instructions which, when executed by the one or more processors, cause the one or more processors to perform the steps of:
   determining a difference between the second specified amount and said fourth amount of binary XML;
   encoding the particular text XML to produce a portion of binary XML that is greater than said difference; and
   including, in the third amount of binary XML, the portion of binary XML and said fourth amount of binary XML.

10. The non-transitory computer-readable storage medium of claim 7, wherein the instructions that cause encoding the particular text XML are included in a set of instructions of a database server that stores the binary XML in an XML repository.

11. The non-transitory computer-readable storage medium of claim 7, wherein:
   the instructions that cause encoding the particular text XML are included in a set of instructions of a client, and
   the request is from a database server that manages an XML repository.

12. The non-transitory computer-readable storage medium of claim 11, wherein the database server repeatedly sends the client requests for specific amounts of binary XML, and loads the binary XML that the database server receives in response to the requests directly into a structure within the database repository without buffering a copy of the binary XML.

* * * * *

UNITED STATES PATENT AND TRADEMARK OFFICE
CERTIFICATE OF CORRECTION

| | | |
|---|---|---|
| PATENT NO. | : 8,010,889 B2 | Page 1 of 1 |
| APPLICATION NO. | : 11/743563 | |
| DATED | : August 30, 2011 | |
| INVENTOR(S) | : Gupta et al. | |

It is certified that error appears in the above-identified patent and that said Letters Patent is hereby corrected as shown below:

Title page 2, Item (56) in column 2, under "Other Publications", line 4, delete "Pulished" and insert -- Published --, therefor.

Title page 2, Item (56) in column 2, under "Other Publications", line 40, delete "XMLover" and insert -- XML over --, therefor.

In column 11, line 16, delete "used" and insert -- use --, therefor.

Signed and Sealed this
Twentieth Day of December, 2011

David J. Kappos
*Director of the United States Patent and Trademark Office*